United States Patent
Pereira et al.

(10) Patent No.: US 7,745,498 B2
(45) Date of Patent: Jun. 29, 2010

(54) NANOWIRE DISPERSION COMPOSITIONS AND USES THEREOF

(75) Inventors: Cheri X. Y. Pereira, Fremont, CA (US); Francesco Lemmi, Sunnyvale, CA (US); David P. Stumbo, Belmont, CA (US)

(73) Assignee: Nanosys, Inc., Palo Alto, CA (US)

( * ) Notice: Subject to any disclaimer, the term of this patent is extended or adjusted under 35 U.S.C. 154(b) by 637 days.

(21) Appl. No.: 11/399,307

(22) Filed: Apr. 6, 2006

(65) Prior Publication Data

US 2006/0257637 A1   Nov. 16, 2006

Related U.S. Application Data

(60) Provisional application No. 60/671,131, filed on Apr. 13, 2005.

(51) Int. Cl.
*B01F 3/12* (2006.01)

(52) U.S. Cl. .................. 516/33; 516/78; 428/143; 428/147; 428/221

(58) Field of Classification Search .............. 516/33
See application file for complete search history.

(56) References Cited

U.S. PATENT DOCUMENTS

| | | | |
|---|---|---|---|
| 5,505,928 A | 4/1996 | Alivisatos et al. | |
| 5,690,807 A | 11/1997 | Clark, Jr. et al. | |
| 5,751,018 A | 5/1998 | Alivisatos et al. | |
| 5,897,945 A | 4/1999 | Lieber et al. | |
| 5,990,479 A | 11/1999 | Weiss et al. | |
| 5,997,832 A | 12/1999 | Lieber et al. | |
| 6,036,774 A | 3/2000 | Lieber et al. | |
| 6,048,616 A | 4/2000 | Gallagher et al. | |
| 6,136,156 A | 10/2000 | El-Shall et al. | |
| 6,225,198 B1 | 5/2001 | Alivisatos et al. | |
| 6,306,736 B1 | 10/2001 | Alivisatos et al. | |
| 6,380,103 B2 | 4/2002 | Gonzalez et al. | |
| 6,413,489 B1 | 7/2002 | Ying et al. | |
| 6,544,326 B1 | 4/2003 | Itou et al. | |
| 6,741,019 B1 * | 5/2004 | Filas et al. .................. | 313/355 |
| 6,781,166 B2 | 8/2004 | Lieber et al. | |
| 6,872,645 B2 | 3/2005 | Duan et al. | |
| 6,878,871 B2 | 4/2005 | Scher et al. | |
| 6,962,823 B2 | 11/2005 | Empedocles et al. | |
| 6,996,147 B2 | 2/2006 | Majumdar et al. | |
| 7,051,945 B2 | 5/2006 | Empedocles et al. | |
| 7,067,328 B2 | 6/2006 | Dubrow et al. | |
| 7,129,554 B2 | 10/2006 | Lieber et al. | |
| 2002/0130311 A1 | 9/2002 | Lieber et al. | |
| 2003/0012723 A1 | 1/2003 | Clarke | |
| 2003/0093107 A1* | 5/2003 | Parsonage et al. .......... | 606/194 |
| 2003/0176566 A1 | 9/2003 | Wight et al. | |
| 2004/0026684 A1 | 2/2004 | Empedocles | |
| 2005/0009224 A1 | 1/2005 | Yang et al. | |
| 2005/0025694 A1 | 2/2005 | Zhang et al. | |
| 2006/0008942 A1 | 1/2006 | Romano et al. | |
| 2006/0009003 A1 | 1/2006 | Romano et al. | |

FOREIGN PATENT DOCUMENTS

| | | |
|---|---|---|
| WO | WO-03085701 | 10/2003 |
| WO | 2004032193 | 4/2004 |
| WO | 2004046021 | 6/2004 |

OTHER PUBLICATIONS

"Preparation of Gold Nanowires and Nanosheets in Bulk Block Copolymer Phase under Mild Conditions", Kim et al. Wiley-VCH Verlag GmbH, Advanced Materials, Mar. 5, 2004, vol. 16 No. 5, p. 459-464.*

He et al. (Dispersion, refinement, and manipulation of single silicon nanowire, Mar. 11, 2002, Applied Physis Letters, vol. 80, No. 10, p. 1812-1814).*

Thurn-Albrecht, T. et al., "Ultrahigh-Density Nanowire Arrays Grown in Self-Assembled Diblock Copolymer Templates" Science (2000) 290:2126-2129.

Bjork, M.T. et al. "One-dimensional steeplechase for electrons realized" Nano Letters (2002) 2:86-90.

Cui, Y. et al. "Doping and electrical transport in silicon nanowires" J. Phys. Chem. B (2000) 104:5213-5216.

Cui, Y. et al. "Diameter-controlled synthesis of single-crystal silicon nanowires" Appl. Phys. Lett. (2001) 78:2214-2216.

Dabbousi, B.O. et al. "(CdSe)ZnS core-shell quantum dots: Synthesis and characterization of a size series of highly luminescent nanocrysallites" J. Phys. Chem. B (1997) 101:9463-9475.

(Continued)

*Primary Examiner*—Ling-Siu Choi
*Assistant Examiner*—Chun-Cheng Wang
(74) *Attorney, Agent, or Firm*—Andrew L. Filler; Donna M. Fabian (57) ABSTRACT

Nanowire dispersion compositions (and uses thereof) are disclosed comprising a plurality of inorganic nanowires suspended in an aqueous or non-aqueous solution comprising at least one low molecular weight and/or low HLB (Hydrophile-Lipophile Balance) value dispersant. Methods of further improving the dispersability of a plurality of inorganic nanowires in an aqueous or non-aqueous solution comprise, for example, oxidizing the surface of the nanowires prior to dispersing the nanowires in the aqueous or non-aqueous solution.

37 Claims, 1 Drawing Sheet

OTHER PUBLICATIONS

Du, C. et al., "Carbon nanotube thin films with ordered structures" J. Mater. Chem. (2005) 15:548-550.

Duan, X. et al. "General synthesis of compound semiconductor nanowires" Adv. Mater. (2000) 12:298-302.

Duan, X. et al., "High-performance thin-film transistors using semiconductor nanowires and nanoribbons" Nature (2003) 425:274-278.

Gudicksen, M.S. et al., "Diameter-selective synthesis of semiconductor nanowires" J. Am. Chem. Soc. (2000) 122:8801-8802.

Gudicksen, M.S. et al. "Synthetic control of the diameter and length of single crystal semiconductor nanowires" J. Phys. Chem. B (2001) 105:4062-4064.

Gudicksen, M.S. et al. "Growth of nanowire superlattice structures for nanoscale photonics and electronics" Nature (2002) 415:617-620.

Jun, Y-W, et al. "Controlled synthesis of multi-armed CdS nanorod architectures using monosurfactant system" J. Am. Chem. Soc. (2001) 123:5150-5151.

Kovtyukhova, N.I. et al., "Individual single-walled nanotubes and hydrogels made by oxidative exfoliation of carbon nanotube ropes" JACS (2003) 125:9761-9769.

Liu, C. et al. "Sol-Gel Synthesis of Free-Standing Ferroelectric Lead Zirconate Titanate Nanoparticles" J. Am. Chem. Soc. (2001) 123:4344-4345.

Manna, L. et al. "Synthesis of Soluble and Processable Rod-,Arrow-, Teardrop-, and Tetrapod-Shaped CdSe Nanocrystals" J. Am. Chem. Soc. (2000) 122:12700-12706.

Manna, L. et al. "Epitaxial growth and photochemical annealing of graded CdS/ZnS shells on colloidal CdSe nanorods" J. Am. Chem. Soc. (2002) 124:7136-7145.

Moore, V.C. et al., "Individually suspended single-walled carbon nanotubes in various surfactants" Nano Lett (2003) 3(10):1379-1382.

Morales, A.M. et al. "A laser ablation method for the synthesis of crystalline semiconductor nanowires" Science (1998) 279:208-211.

Peng, X. et al. "Epitaxial growth of highly luminescent CdSe/CdS core/shell nanocrystals with photostability and electronic accessibility" J. Am. Chem. Soc. (1997) 119:7019-7029.

Peng, X. et al., "Shape control of CdSe nanocrystals" Nature (2000) 404:59-61.

Puntes, V.F. et al., "Colloidal nanocrystal shape and size control: The case of cobalt" Science (2001) 291:2115-2117.

Urban, J.J. et al. "Synthesis of single-crystalline perovskite nanowires composed of barium titanate and strontium titanate" J. Am. Chem. Soc. (2002) 124:1186-1187.

Whang, D. et al., "Nanolithography using hierarchically assembled nanowire masks" Nano Lett (2003) 3(7):951-954.

Whang, D. et al., "Large-scale hierarchical organization of nanowire arrays for integrated nanosystems" (2003).

Wu, Y. et al. "Block-by-block growth of single-crystalline Si/SiGe superlattice nanowires" Nano Letters (2002) 2:83-86.

Yun, W.S. et al. "Ferroelectric Properties of Individual Barium Titanate Nanowires Investigated by Scanned Probe Microscopy" Nanoletters (2002) 2:447-450.

Extended Search Report issued Aug. 4, 2009 for corresponding European Application 06749643.0.

* cited by examiner

NANOWIRE DISPERSION COMPOSITIONS AND USES THEREOF

CROSS-REFERENCE TO RELATED APPLICATIONS

This application claims the benefit of U.S. Provisional Patent Application No. 60/671,131, filed Apr. 13, 2005, which is incorporated in its entirety herein.

STATEMENT REGARDING FEDERALLY SPONSORED RESEARCH

Not applicable

BACKGROUND OF THE INVENTION

Nanotechnology has been simultaneously heralded as the next technological evolution that will pave the way for the next societal evolution, and lambasted as merely the latest batch of snake oil peddled by the technically overzealous. Fundamentally both sides of the argument have a number of valid points to support their position. For example, it is absolutely clear that nanomaterials possess very unique and highly desirable properties in terms of their chemical, structural and electrical capabilities. However, it is also clear that, to date, there has been very little discussion of technology for manufacturing and integrating nanoscale materials into the macroscale world in a reasonable commercial fashion and/or how to assemble these nanomaterials into more complex systems for the more complex prospective applications, e.g., nanocomputers, nanoscale machines, electronic devices etc. A variety of early researchers have proposed a number of different ways to address the integration and assembly questions by waiving their hands and speaking of molecular self assembly, electromagnetic assembly techniques and the like. However, there has been either little published success or little published effort in these areas.

In certain cases, uses of nanomaterials have been proposed that exploit the unique and interesting properties of these materials more as a bulk material than as individual elements requiring individual assembly. For example, Duan et al., Nature 425:274-278 (September 2003), describes a nanowire based transistor for use in large area electronic substrates, e.g., for displays, antennas, etc., that employs a bulk processed, oriented semiconductor nanowire film or layer in place of a rigid semiconductor wafer. The result is an electronic substrate that performs on par with a single crystal wafer substrate, but that is manufacturable using conventional and less expensive processes that are used in the poorer performing amorphous semiconductor processes, and is more amenable to varied architectures, e.g., flexible and/or shaped materials. In accordance with this technology, the only new process requirement is the ability to provide a film of nanowires that are substantially oriented along a given axis. The technology for such orientation has already been described in detail in, e.g., International Publication Nos. WO 03/085700, WO 03/085701 and WO 2004/032191, as well as U.S. Patent Publication No. 20050066883 (the full disclosures of each of which are hereby incorporated by reference herein, in their entirety for all purposes) and is readily scalable to manufacturing processes.

In another exemplary case, bulk processed nanocrystals have been described for use as a flexible and efficient active layer for photoelectric devices. In particular, the ability to provide a quantum confined semiconductor crystal in a hole conducting matrix (to provide type-II bandgap offset), allows the production of a photoactive layer that can be exploited either as a photovoltaic device or photoelectric detector. When disposed in an active composite, these nanomaterials are simply processed using standard film coating processes that are available in the industry. See, e.g., U.S. Patent Publication No. 20040118448 incorporated herein by reference in its entirety for all purposes.

Regardless of the applications to which nanomaterials are to be put, there exists a need for the improved production, processing and integration of these materials into their ultimate application or device. In particular, one of the remaining challenges in the realization of functional nanostructures is to figure out ways to gain reliable control over their surface chemistry and to improve their dispersability in aqueous and non-aqueous media and the like to improve the handling and processability of these materials. The present invention meets these and a variety of other needs.

BRIEF SUMMARY OF THE INVENTION

The present invention is generally directed to nanowire dispersion compositions for dispersing nanowires (e.g., inorganic nanowires such as semiconductor nanowires) in different aqueous or non-aqueous solvents (e.g., distilled water, ethanol, methanol, dimethylformamide (DMF), combinations thereof, etc.) using one or more surfactants to improve the solubility and processability of the resultant nanowire thin films. Dispersing of nanowires in different compositions facilitates the manipulation of the wires and provides stable films of nanowires which are useful building blocks for high performance electronics and other devices and systems described further below. The nanowire dispersion composition can be formulated to exhibit a broad range of desired properties such as surface tension and viscosity, to minimize wire aggregation, to exhibit rapid drying when applied as a thin film to a device substrate, and to provide a dispersion composition that is stable over useful periods of time.

In accordance with a first aspect of the present invention, a nanowire dispersion composition is disclosed which generally comprises a plurality of nanowires suspended in a solvent (e.g., ethanol, water, methanol, etc. and/or combinations thereof) and comprising at least one low molecular weight (e.g., less than about 10,000, e.g., less than about 5,000, e.g., less than about 3,000) surfactant selected from the group comprising an anionic, cationic, nonionic, amphoteric or polymeric surfactant. In one presently preferred embodiment, the nanowire dispersion composition comprises a dispersant selected from a nonionic or polymeric dispersant. For example, the dispersant is selected from the group comprising SilWet®, Surfynol®, a Pluronic polymer, and combinations and mixtures thereof. The combination of the dispersant with one or more low chain polymeric dispersants such as Ammonium polyacrylate Acrysol G-111 (AG-111), polyvinyl alcohol (PVA), and polyvinyl pyrrolidone (PVP) has further been found to provide enhanced wire dispersity and coating uniformity.

It has also been found that dispersants with both lower molecular weights and lower HLB (Hydrophile-Lipophile Balance) values (e.g., less than about 20, e.g., less than about 15, e.g., less than about 10) provide the best wire dispersion and coating uniformity. The nanowire dispersion composition may comprise, for example, between about 0.01 to 20% by weight of dispersant, for example, between about 1 to 15 wt % dispersant, for example, between about 1 to 8 wt % dispersant. The nanowire dispersion composition may also comprise one or more binders, e.g., one or more water soluble or dissipatable polymers selected from the group comprising polyvinyl alcohol, polyvinyl pyrrolidone, methyl cellulose, and hydroxyl ethyl cellulose and the like. The dispersant compositions of the present invention find particular utility with inorganic nanowires such as semiconductor (e.g., silicon) or metal oxide nanowires, but can also be used with other nanowire materials as well such as conductive polymers, ceramics etc. The nanowire dispersion compositions of the present invention work particularly well with nanowires having an aspect ratio greater than about 10, e.g., greater than about 100, e.g., greater than about 1000.

Optionally, in another aspect of the present invention, the nanowires may be oxidized prior to being suspended in the nanowire dispersion compositions of the present invention, e.g., the nanowires may be thermally oxidized in a rapid thermal oxidation (RTO) chamber or in a conventional oxidation furnace, in order to further improve the coating and solution uniformity of the nanowire dispersion composition.

The present invention provides flexible (e.g., plastic) or rigid (e.g., glass or semiconductor) substrates comprising the nanowire dispersion composition of the present invention deposited as a thin film thereon, which substrates can be used in various electrical systems, optical systems, consumer electronics, industrial electronics, wireless systems, space applications, or any other application including, for example, active matrix displays, antenna arrays, radiofrequency identification tags, smart cards, optical sensors, etc.

DETAILED DESCRIPTION OF THE INVENTION

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanowire (NW) (and nanorod, nanotube, and nanoribbon etc.) technologies and other functional aspects of the systems (and components of the individual operating components of the systems) may not be described in detail herein. Furthermore, for purposes of brevity, the invention is frequently described herein as pertaining to nanowires.

Individual inorganic nanowires (NWs) (e.g., semiconductor nanowires such as silicon nanowires) can be used to fabricate nanoscale field effect transistors (FETs) with electronic performance comparable to and in some case exceeding that of the highest-quality single-crystal materials currently commercially available. These nano-FETs are extending Moore's law toward the molecular level. They are, however, currently difficult to implement for production-scale nanoelectronics due to the complexity and limited scalability of the device fabrication processes. Successful implementation of nanowires in electronic device requires methods to deposit and pattern them over wide area substrates uniformly at high density and with minimum aggregation. To do so requires the use of dispersants or additives to properly disperse the nanowires in solution so that they can be deposited on electronic device substrates in a controlled and reproducible manner suitable for commercial applications.

It should be appreciated that although nanowires are frequently referred to, the techniques described herein are also applicable to other nanostructures, such as nanorods, nanotubes, nanotetrapods, nanoribbons and/or combinations thereof. It should further be appreciated that the processing techniques described herein could be used with any semiconductor device type, and other electronic component types. Further, the techniques would be suitable for application in electrical systems, optical systems, consumer electronics, industrial electronics, wireless systems, space applications, or any other application.

As used herein, an "aspect ratio" is the length of a first axis of a nanowire divided by the average of the lengths of the second and third axes of the nanowire, where the second and third axes are the two axes whose lengths are most nearly equal to each other. For example, the aspect ratio for a perfect wire would be the length of its long axis divided by the diameter of a cross-section perpendicular to (normal to) the long axis.

The term "heterostructure" when used with reference to nanowires refers to structures characterized by at least two different and/or distinguishable material types. Typically, one region of the nanowire comprises a first material type, while a second region of the nanowire comprises a second material type. In certain embodiments, the nanowire comprises a core of a first material and at least one shell of a second (or third etc.) material, where the different material types are distributed radially about the long axis of a nanowire, a long axis of an arm of a branched nanocrystal, or the center of a nanocrystal, for example. A shell need not completely cover the adjacent materials to be considered a shell or for the nanowire to be considered a heterostructure. For example, a nanowire characterized by a core of one material covered with small islands of a second material is a heterostructure. In other embodiments, the different material types are distributed at different locations within the nanowire. For example, material types can be distributed along the major (long) axis of a nanowire. Different regions within a heterostructure can comprise entirely different materials, or the different regions can comprise a base material.

As used herein, a "nanostructure" is a structure having at least one region or characteristic dimension with a dimension of less than about 500 nm, e.g., less than about 200 nm, less than about 100 nm, less than about 50 nm, or even less than about 20 nm. Typically, the region or characteristic dimension will be along the smallest axis of the structure. Examples of such structures include nanowires, nanorods, nanotubes, branched nanocrystals, nanotetrapods, tripods, bipods, nanocrystals, nanodots, quantum dots, nanoparticles, branched tetrapods (e.g., inorganic dendrimers), and the like. Nanostructures can be substantially homogeneous in material properties, or in certain embodiments can be heterogeneous (e.g., heterostructures). Nanostructures can be, for example, substantially crystalline, substantially monocrystalline, polycrystalline, amorphous, or a combination thereof. In one aspect, each of the three dimensions of the nanostructure has a dimension of less than about 500 nm, for example, less than about 200 nm, less than about 100 nm, less than about 50 nm, or even less than about 20 nm.

As used herein, the term "nanowire" generally refers to any elongated conductive or semiconductive material (or other material described herein) that includes at least one cross sectional dimension that is less than 500 nm, and preferably, less than 100 nm, and has an aspect ratio (length:width) of greater than 10, preferably greater than 50, and more preferably, greater than 100, or greater than 1000.

The nanowires of this invention can be substantially homogeneous in material properties, or in certain embodiments can be heterogeneous (e.g., nanowire heterostructures). The nanowires can be fabricated from essentially any convenient material or materials, and can be, e.g., substantially crystalline, substantially monocrystalline, polycrystalline, or amorphous. Nanowires can have a variable diameter or can have a substantially uniform diameter, that is, a diameter that shows a variance less than about 20% (e.g., less than about 10%, less than about 5%, or less than about 1%) over the region of greatest variability and over a linear dimension of at least 5 nm (e.g., at least 10 nm, at least 20 nm, or at least 50 nm). Typically the diameter is evaluated away from the ends of the nanowire (e.g. over the central 20%, 40%, 50%, or 80% of the nanowire). A nanowire can be straight or can be e.g. curved or bent, over the entire length of its long axis or a portion thereof. In certain embodiments, a nanowire or a portion thereof can exhibit two- or three-dimensional quantum confinement. Nanowires according to this invention can expressly exclude carbon nanotubes, and, in certain embodiments, exclude "whiskers" or "nanowhiskers", particularly whiskers having a diameter greater than 100 nm, or greater than about 200 nm. Examples of such nanowires include semiconductor nanowires as described in Published International Patent Application Nos. WO 02/17362, WO 02/48701, and WO 01/03208, carbon nanotubes, and other elongated conductive or semiconductive structures of like dimensions, which are incorporated herein by reference.

As used herein, the term "nanorod" generally refers to any elongated conductive or semiconductive material (or other material described herein) similar to a nanowire, but having an aspect ratio (length:width) less than that of a nanowire. Note that two or more nanorods can be coupled together along their longitudinal axis so that the coupled nanorods span all the way between electrodes. Alternatively, two or more nanorods can be substantially aligned along their longitudinal axis, but not coupled together, such that a small gap exists between the ends of the two or more nanorods. In this case, electrons can flow from one nanorod to another by hopping from one nanorod to another to traverse the small gap. The two or more nanorods can be substantially aligned, such that they form a path by which electrons can travel between electrodes.

A wide range of types of materials for nanowires, nanorods, nanotubes and nanoribbons can be used, including semiconductor material selected from, e.g., Si, Ge, Sn, Se, Te, B, C (including diamond), P, B—C, B—P($BP_6$), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/InSb, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, BeSiN$_2$, CaCN$_2$, ZnGeP$_2$, CdSnAs$_2$, ZnSnSb$_2$, CuGeP$_3$, CuSi$_2$P$_3$, (Cu, Ag)(Al, Ga, In, Tl, Fe)(S, Se, Te)$_2$, Si$_3$N$_4$, Ge$_3$N$_4$, Al$_2$O$_3$, (Al, Ga, In)$_2$ (S, Se, Te)$_3$, Al$_2$CO, and an appropriate combination of two or more such semiconductors.

The nanowires can also be formed from other materials such as metals such as gold, nickel, palladium, iradium, cobalt, chromium, aluminum, titanium, ruthenium, tin and the like, metal alloys, polymers, conductive polymers, ceramics, and/or combinations thereof. Other now known or later developed conducting or semiconductor materials can be employed.

In certain aspects, the nanowire may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si; or an n-type dopant selected from a group consisting of: Si, Ge, Sn, S, Se and Te. Other now known or later developed dopant materials can be employed.

Additionally, the nanowires or nanoribbons can include carbon nanotubes, or nanotubes formed of conductive or semiconductive organic polymer materials, (e.g., pentacene and transition metal oxides).

Hence, although the term "nanowire" is referred to throughout the description herein for illustrative purposes, it is intended that the description herein also encompass the use of nanotubes (e.g., nanowire-like structures having a hollow tube formed axially therethrough). Nanotubes can be formed in combinations/thin films of nanotubes as is described herein for nanowires, alone or in combination with nanowires, to provide the properties and advantages described herein.

It should be understood that the spatial descriptions (e.g., "above", "below", "up", "down", "top", "bottom", etc.) made herein are for purposes of illustration only, and that devices of the present invention can be spatially arranged in any orientation or manner.

Types of Nanowires and their Synthesis

Figure 1A:
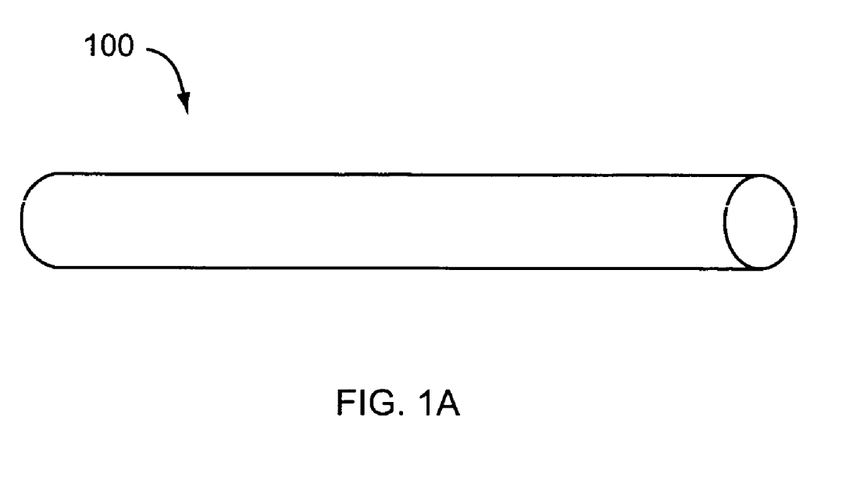
FIG. 1A illustrates a single crystal semiconductor nanowire core (hereafter "nanowire") 100.

FIG. 1A illustrates a single crystal semiconductor nanowire core (hereafter "nanowire") 100. FIG. 1A shows a nanowire 100 that is a uniformly doped single crystal nanowire. Such single crystal nanowires can be doped into either p- or n-type semiconductors in a fairly controlled way. Doped nanowires such as nanowire 100 exhibit improved electronic properties. For instance, such nanowires can be doped to have carrier mobility levels comparable to bulk single crystal materials.

Figure 1B:
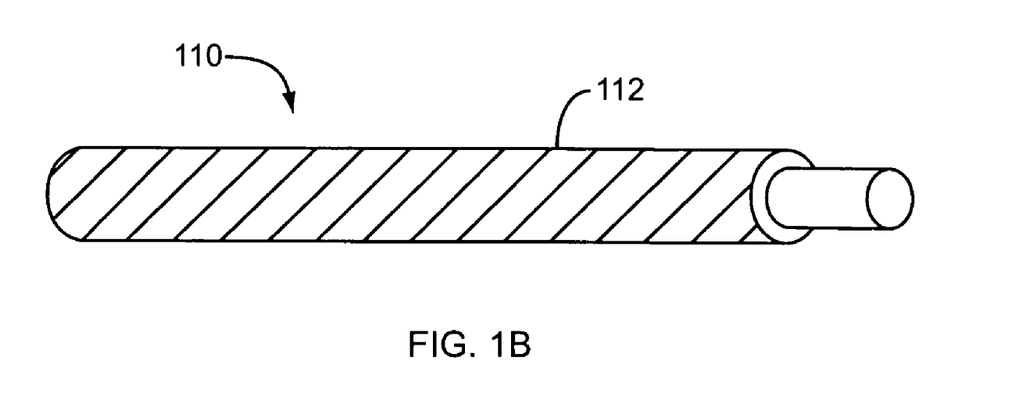
FIG. 1B shows a nanowire 110 doped according to a core-shell structure.

FIG. 1B shows a nanowire 110 doped according to a core-shell structure. As shown in FIG. 1B, nanowire 110 has a doped surface layer 112, which can have varying thickness levels, including being only a molecular monolayer on the surface of nanowire 110.

The valence band of the insulating shell can be lower than the valence band of the core for p-type doped wires, or the conduction band of the shell can be higher than the core for n-type doped wires. Generally, the core nanostructure can be made from any metallic or semiconductor material, and the shell can be made from the same or a different material. For example, the first core material can comprise a first semiconductor selected from the group consisting of: a Group II-VI semiconductor, a Group III-V semiconductor, a Group IV semiconductor, and an alloy thereof. Similarly, the second material of the shell can comprise a second semiconductor, the same as or different from the first semiconductor, e.g., selected from the group consisting of: a Group II-VI semiconductor, a Group III-V semiconductor, a Group IV semiconductor, and an alloy thereof. Example semiconductors include, but are not limited to, CdSe, CdTe, InP, InAs, CdS, ZnS, ZnSe, ZnTe, HgTe, GaN, GaP, GaAs, GaSb, InSb, Si, Ge, AlAs, AlSb, PbSe, PbS, and PbTe. As noted above, metallic materials such as gold, chromium, tin, nickel, aluminum etc. and alloys thereof can be used as the core material, and the metallic core can be overcoated with an appropriate shell material such as silicon dioxide, carbides, nitrides or other insulating materials Nanostructures can be fabricated and their size can be controlled by any of a number of convenient methods that can be adapted to different materials. For example, synthesis of nanocrystals of various composition is described in, e.g., Peng et al. (2000) "Shape Control of CdSe Nanocrystals" *Nature* 404, 59-61; Puntes et al. (2001) "Colloidal nanocrystal shape and size control: The case of cobalt" *Science* 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 5,505,928 to Alivisatos et al. (Apr. 9, 1996) entitled "Preparation of III-V semiconductor nanocrystals"; U.S. Pat. No. 5,751,018 to Alivisatos et al. (May 12, 1998) entitled "Semiconductor nanocrystals covalently bound to solid inorganic surfaces using self-assembled monolayers"; U.S. Pat. No. 6,048,616 to Gallagher et al. (Apr. 11, 2000) entitled "Encapsulated quantum sized doped semiconductor particles and method of manufacturing same"; and U.S. Pat. No. 5,990,479 to Weiss et al. (Nov. 23, 1999) entitled "Organo luminescent semiconductor nanocrystal probes for biological applications and process for making and using such probes."

Growth of nanowires having various aspect ratios, including nanowires with controlled diameters, is described in, e.g., Gudiksen et al (2000) "Diameter-selective synthesis of semiconductor nanowires" *J. Am. Chem. Soc.* 122, 8801-8802; Cui et al. (2001) "Diameter-controlled synthesis of single-crystal silicon nanowires" *Appl. Phys. Lett.* 78, 2214-2216; Gudiksen et al. (2001) "Synthetic control of the diameter and length of single crystal semiconductor nanowires" *J. Phys. Chem. B* 105,4062-4064; Morales et al. (1998) "A laser ablation method for the synthesis of crystalline semiconductor nanowires" *Science* 279, 208-211; Duan et al. (2000) "General synthesis of compound semiconductor nanowires" *Adv. Mater.* 12, 298-302; Cui et al. (2000) "Doping and electrical transport in silicon nanowires" *J. Phys. Chem. B* 104, 5213-5216; Peng et al. (2000) "Shape control of CdSe nanocrystals" *Nature* 404, 59-61; Puntes et al. (2001) "Colloidal nanocrystal shape and size control: The case of cobalt" *Science* 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 6,036,774 to Lieber et al. (Mar. 14, 2000) entitled "Method of producing metal oxide nanorods"; U.S. Pat. No. 5,897,945 to Lieber et al. (Apr. 27, 1999) entitled "Metal oxide nanorods"; U.S. Pat. No. 5,997,832 to Lieber et al. (Dec. 7, 1999) "Preparation of carbide nanorods"; Urbau et al. (2002) "Synthesis of single-crystalline perovskite nanowires composed of barium titanate and strontium titanate" *J. Am. Chem. Soc.,* 124, 1186; and Yun et al. (2002) "Ferroelectric Properties of Individual Barium Titanate Nanowires Investigated by Scanned Probe Microscopy" *Nanoletters* 2, 447.

Growth of branched nanowires (e.g., nanotetrapods, tripods, bipods, and branched tetrapods) is described in, e.g., Jun et al. (2001) "Controlled synthesis of multi-armed CdS nanorod architectures using monosurfactant system" *J. Am. Chem. Soc.* 123, 5150-5151; and Manna et al. (2000) "Synthesis of Soluble and Processable Rod-, Arrow-, Teardrop-, and Tetrapod-Shaped CdSe Nanocrystals" *J. Am. Chem. Soc.* 122, 12700-12706.

Synthesis of nanoparticles is described in, e.g., U.S. Pat. No. 5,690,807 to Clark Jr. et al. (Nov. 25, 1997) entitled "Method for producing semiconductor particles"; U.S. Pat. No. 6,136,156 to El-Shall, et al. (Oct. 24, 2000) entitled "Nanoparticles of silicon oxide alloys"; U.S. Pat. No. 6,413, 489 to Ying et al. (Jul. 2, 2002) entitled "Synthesis of nanom-eter-sized particles by reverse micelle mediated techniques"; and Liu et al. (2001) "Sol-Gel Synthesis of Free-Standing Ferroelectric Lead Zirconate Titanate Nanoparticles" *J. Am. Chem. Soc.* 123, 4344. Synthesis of nanoparticles is also described in the above citations for growth of nanocrystals, nanowires, and branched nanowires, where the resulting nanostructures have an aspect ratio less than about 1.5.

Furthermore, nanowire structures with one or multiple shells can also be fabricated. Synthesis of core-shell nanowire (and other nanocrystal) heterostructures are described in, e.g., Berkeley U.S. Patent Application Pub. No. 20020172820; co-assigned and pending U.S. Ser. No. 60/605,454 entitled "Processes for Manufacturing, Harvesting, and Integrating Nanowires into Functional Nanowire Based Devices," filed Aug. 30, 2004; Peng et al. (1997) "Epitaxial growth of highly luminescent CdSe/CdS core/shell nanocrystals with photostability and electronic accessibility" J. Am. Chem. Soc. 119, 7019-7029; Dabbousi et al. (1997) "(CdSe)ZnS core-shell quantum dots: Synthesis and characterization of a size series of highly luminescent nanocrysallites" J. Phys. Chem. B 101, 9463-9475; Manna et al. (2002) "Epitaxial growth and photochemical annealing of graded CdS/ZnS shells on colloidal CdSe nanorods" J. Am. Chem. Soc. 124, 7136-7145, the entire contents of each of which are incorporated by reference herein. Similar approaches can be applied to the growth of other core-shell nanostructures including nanowires.

Growth of nanowire heterostructures in which the different materials are distributed at different locations along the long axis of the nanowire is described in, e.g., Gudiksen et al. (2002) "Growth of nanowire superlattice structures for nanoscale photonics and electronics" *Nature* 415, 617-620; Bjork et al. (2002) "One-dimensional steeplechase for electrons realized" *Nano Letters* 2, 86-90; Wu et al. (2002) "Block-by-block growth of single-crystalline Si/SiGe superlattice nanowires" *Nano Letters* 2, 83-86; and U.S. Publication No. 20040026684. Similar approaches can be applied to growth of other heterostructures.

In one embodiment of the invention, the nanowires may be synthesized on a growth substrate, and then transferred and incorporated into the ultimate device substrate using the nanowire dispersion compositions of the present invention. For example, in certain aspects, inorganic semiconductor or semiconductor oxide nanowires are grown on the surface of a growth substrate using a colloidal catalyst based vapor-liquid-solid (VLS) synthesis method. In accordance with this synthesis technique, a colloidal catalyst (e.g., gold, platinum etc. particles) is deposited upon the desired surface of the substrate. The substrate including the colloidal catalyst is then subjected to the synthesis process which generates nanowires attached to the surface of the substrate. Other synthetic methods include the use of thin catalyst films, e.g., 50 nm or less, deposited over the surface of the substrate. The heat of the VLS process then melts the film to form small droplets of catalyst that forms the nanowires. Typically, this latter method may be employed where fiber diameter homogeneity is less critical to the ultimate application. Typically, catalysts comprise metals, e.g., gold or platinum, and may be electroplated or evaporated onto the surface of the substrate or deposited in any of a number of other well known metal deposition techniques, e.g., sputtering etc. In the case of colloid deposition the colloids are typically deposited by first treating the surface of the substrate so that the colloids adhere to the surface. The substrate with the treated surface is then immersed in a suspension of colloid. Furthermore, as described above, nanowire structures with one or multiple shells can also be fabricated.

Following growth of the nanowires, the nanowires are then harvested from their synthesis location. As described further below, the nanowires typically are introduced into a solution having one or more surfactants and/or other compounds therein. A variety of other deposition methods, e.g., as described in U.S. Patent Publication No. 20050066883, and U.S. Patent Publication No. 20040005723, the full disclosures of which are incorporated herein by reference in their entirety for all purposes, may also be used to deposit nanowires onto a device substrate.

Nanowire Dispersion Compositions

Nanowires may be suspended in various anionic, nonionic, amphoteric and cationic surfactants and polymers to improve their dispersability in liquid media such as aqueous and polar solvents. Preferably the nanowire solution comprises at least one dispersant. Suitable dispersants include both polymeric surfactants and anionic, cationic, amphoteric and nonionic surfactants as described further below.

In particular, the nanowire dispersion compositions of the invention include a liquid medium or solution having dispersed therein a plurality of nanowires (e.g., inorganic nanowires such as semiconductor nanowires, e.g., silicon nanowires). The liquid medium can be entirely water, can contain water in combination with one or more organic solvents, or can be entirely organic solvent. In one embodiment, the liquid medium contains water, e.g., at least 20% by weight water, for example, between about 50% and 100% water.

An organic solvent can be included in the liquid medium, e.g., to control surface tension of the nanowire dispersion composition, to allow dissolution of the dispersant, or, as a minor component of any of the ingredients, e.g., an organic solvent may be present in a surfactant added as an ingredient to the dispersion composition.

The organic solvent, when present, can be any number of organic solvents known to those of ordinary skill in the art. For example, suitable water-miscible organic solvents include $C_{1-5}$-alkanols, e.g. methanol, ethanol, n-propanol, isopropanol, n-butanol, sec-butanol, tert-butanol and isobutanol; amides, e.g. dimethylformamide and dimethylacetamide; ketones and ketone alcohols, e.g. acetone and diacetone alcohol; $C_{2-4}$-ether, e.g. tetrahydrofuran and dioxane; alkylene glycols or thioglycols containing a $C_{2-6}$ alkylene group, e.g. ethylene glycol, propylene glycol, butylene glycol, pentylene glycol and hexylene glycol; poly(alkylene-glycol)s and thioglycol)s, e.g. diethylene glycol, thiodiglycol, polyethylene glycol and polypropylene glycol; polyols, e.g. glycerol and 1,2,6-hexanetriol; and lower alkyl glycol and polyglycol ethers, e.g., 2-methoxyethanol, 2-(2-methoxyethoxy) ethanol, 2-(2-ethoxyethoxy)ethanol, 2-(2-butoxyethoxy) ethanol, 3-butoxypropan-1-ol, 2-[2-(2-methoxyethoxy)-ethoxy]ethanol, 2-[2-(2-ethoxyethoxy)ethoxy]-ethanol; cyclic esters and cyclic amides, e.g. optionally substituted pyrrolidones; sulpholane; and mixtures containing two or more of the aforementioned water-miscible organic solvents.

The amount of organic solvent and/or water within the liquid medium can depend on a number of factors, such as the particularly desired properties of the nanowire dispersion composition such as the viscosity, surface tension, drying rate, etc., which can in turn depend on factors such as the type of substrate the nanowire dispersion is intended to be deposited on, the size, shape, composition, and/or aspect ratio of the nanowires, etc.. For some applications, the liquid medium can comprise an aqueous solution including a mixture of water and solvent. For such water-based media, preferred amounts of organic solvent can be in the range from 0 to about 80 parts by weight organic solvent based on 100 parts by weight of the liquid medium (defined as water plus organic solvent), for example, from about 2 to 50 parts by weight organic solvent per 100 parts liquid medium.

To achieve a particularly good dispersion additional dispersants may be added. Preferably the dispersant is a surfactant. Exemplary surfactants are anionic surfactants such as; sodium dodecyl sulphate, ammonium dodecyl benzene sulphonate, sodium nonoxynyl phosphate, sodium dioctyl sulphosuccinate; nonionic surfactants such as alkyl phenol ethoxylates, alkyl ethoxylates, polyoxyethylene polyoxypropylene block copolymers; cationic surfactants such as; dodecyl trimethyl ammonium bromide, bis(2-hydroxyethyl)tallow amine; and amphoteric surfactants such as ammonium cocoaminopropionamide. The choice of dispersants will be governed by many factors including; the amount of polymer to be dispersed; the nature of the liquid medium; the size, shape, composition, or aspect ratio of the nanowires; the material type of nanowires, etc. For an optimum dispersion it may be necessary to use a mixture of several dispersants.

Specific examples of commercially available anionic surfactants that can be used in practicing the present invention include, for example, sodium dodecylbenzenesulfonate (SDBS—Sigma Aldrich, Inc.); sodium alkyl allyl sulfosuccinate (TREM—Cognis Corporation); sodium n-lauroylsarcosinate (Sarkosyl—Sigma Aldrich); sodium dodecyl sulfate (SDS—Sigma Aldrich); polystyrene sulfonate (PSS—Sigma Aldrich). Specific examples of commercially available cationic surfactants that can be used in practicing the methods of the present invention include, for example, dodecyltrimethylammonium bromide (DTAB—Sigma Aldrich) and cetyltrimethylammonium bromide (CTAB—Sigma Aldrich). Specific Examples of commercially available nonionic surfactants include for example Surfynol 420, Surfynol 440, Surfynol 211, and Surfynol 221 (Air products, PA); Brij (Sigma Aldrich); Tween (Sigma Aldrich); Triton X (e.g., Triton X-100, Triton X-405, etc.—Sigma Aldrich); Span (e.g., Span 20, Span 40, Span 80, Span 85, etc.—Sigma Aldrich) poly(vinylpyrrolidone) (PVP—Sigma Aldrich); Silwet (e.g., Silwet® L-77, L-7608, and L-7280 —General Electric); PEO-PBO-PEO triblock copolymer (EBE—Dow Chemical Corp.); PEO-PPO-PEO triblock polymer (Pluronic series of compounds—BASF).

It was found by the inventors of the present invention that surfactants with lower molecular weight (e.g., those having a molecular weight less than about 10,000, e.g. less than about 5,000, e.g., less than about 3,000) and/or lower HLB (Hydrophile-Lipophile Balance) values (e.g., between about 1 to 20, e.g., between about 1 to 15, e.g., between about 1 to 10, e.g., between about 1 to 8), are preferred surfactants and provide the most consistent nanowire dispersability in aqueous (or non-aqueous) solution. The most preferable dispersants were found to be those surfactants with both lower molecular weight and lower HLB values (e.g., Pluronic series surfactants Pluronic L-31, Pluronic L-62 and Pluronic L-81; SilWet series surfactants SilWet L-77, SilWet L-7280, and SilWet L-7608; and Surfynol surfactants Surfynol 420 and Surfynol 440), and the combination of the surfactants with long chain polymeric dispersants (e.g., Ammonium polyacrylate Acrysol G-111 (AG-111), PVA, and PVP) which provide good wire dispersity and surface property of the coating. It was found that because of the typically high surface area (e.g., greater than above 28 $cm^2/g$) and high aspect ratio (e.g., typically greater than about 1,000) of the nanowires, the content of the dispersant(s) used to disperse the nanowires in aqueous solution should be in a range of between about 0.01 to 20 wt %, more preferably in the range of about 1.0 to 15.0 wt %, for example, between about 1.0 and 8 wt % based on the total weight of the nanowire solution. Generally, if the content is less than 0.5 wt %, the dispersion of the nanowires tends to become insufficient and wire aggregation will occur. If the dispersant concentration is too high, the nanowire dispersion composition contains the dispersant in an amount that gives too high a viscosity, which can negatively affect the ability to apply the nanowire dispersion composition to a device substrate. Furthermore, if the dispersant concentration is so high as to exceed the solubility of the dispersant in the liquid medium, phase separation will occur. The appropriate amount of dispersant will depend on a number of factors such as the type of nanowires to be dispersed, the size, shape, composition and aspect ratio of the nanowires, the identity of the liquid medium, e.g., whether the liquid medium comprises a polar solvent such as water of a non-polar organic solvent, etc.

To the nanowire dispersion composition of the present invention, one or more binders may be added as necessary. The binder is preferably a polymeric or polymerisable binder, more preferably a water-soluble or water-dissipatable polymeric or polymerisable binder. Examples of water-soluble binders include starches, e.g., hydroxy alkyl starches, for example hydroxyethylstarch; celluloses, for example cellulose, methylcellulose, hydroxyethylcellulose, hydroxypropylcellulose, hydroxyethyl methyl cellulose and carboxymethylcellulose (and salts thereof) and cellulose acetate butyrate; gelatin; gums, for example guar, xanthan gum and gum arabic; polyvinylalcohol; polyvinylphosphate; polyvinylpyrrolidone; polyvinylpyrrolidine; polyethylene glycol; hydrolysed polyvinylacetate; polyethylene imine; polyacrylamides, for example polyacrylamide and poly(N,N-dimethyl acrylamide); acrylamide-acrylic acid copolymers; polyvinylpyridine; polyvinylphosphate; vinylpyrrolidone-vinyl acetate copolymers; vinyl pyrrolidone-styrene copolymers; polyvinylamine; poly(vinyl pyrrolidonedialkylaminoalkyl alkylacrylates), for example poly vinylpyrrolidone-diethylaminomethylmethacrylate; acid-functional acrylic polymers and copolymers, for example poly(meth)acrylic acid and copolymers of (meth)acrylic acid and other (meth)acrylate monomers; amine-functional acrylic polymers and copolymers, for example polydimethylaminoethylmethacrylate; acid or amine functional urethane polymers, e.g., those containing dimethyioipropanoic acid and/or pendant or terminal polyethylene glycols; ionic polymers, especially cationic polymers, for example poly (N,N-dimethyl-3,5-dimethylene piperidinium chloride); polyesters, preferably those which carry water-solubilising groups, especially acid groups, for example polyesters obtainable by polymerising a polyol with sodiosulphoisophthalic acid.

Examples of water-dissipatable binders are water-dissipatable polymers, for example, latex polymers, for example cationic, nonionic, and anionic surface modified styrene-butadiene latexes; vinyl acetate-acrylic copolymer latexes; acrylic copolymer latexes which carry quaternary ammonium groups, for example a polymethylacrylate trimethylammonium chloride latex; and dispersions of poly(acrylate), poly(methacrylate), polyester, polyurethane or vinyl polymers and copolymers thereof. The polymer dispersions may be prepared, for example, by emulsion, suspension, bulk or solution polymerisation followed by dispersion into water. The binder may comprise a single binder or comprise a mixture of two or more binders, especially the exemplary binders described above.

Oligomeric polyols may be used to provide toughness and hydrophobic or hydrophilic characteristics to a polymer dispersant. Oligomeric polyols are defined as polyols having a number average molecular weight between about 500 and 5000 Daltons. Preferred members of this class are polyester diols, polyether diols and polycarbonate diols.

Other useful additives which will also help to control drying rate include trimethylol propane, urea and its derivatives, amides, hydroxyether derivatives such as butyl carbitol or Cellosolve™, amino alcohols, and other water soluble or water miscible materials, as well as mixtures thereof. Other additives commonly known in the art include biocides, fungicides, defoamers, corrosion inhibitors, viscosity modifiers, pH buffers, penetrants, sequestering agents, and the like. The nanowires may also be incorporated with a water-soluble high polymer such as PVA or PVP, a thermosetting resin such as acryl emulsion, or a crosslinking agent such as ADC or diazonium salt may be added, if necessary. Heating of the nanowire dispersion composition may also help the surface uniformity of coatings.

Oxidation of Nanowires to Improve their Dispersability and Processability

In order to further improve the dispersability and processability of nanowires (e.g., inorganic nanowires such as semiconductor (e.g., silicon) nanowires) in solvents such as aqueous solutions and make it easier for nanowire thin film deposition, the nanowire surface may be further treated by oxidation (e.g., either on or off of the growth substrate) prior to dispersing them in the solvent. The surface properties of naturally grown nanowires tend to be quite complicated because the wire surfaces are often only partially oxidized with an amorphous oxide layer during the nanowire synthesis process described previously. For example, it has been found that as-grown silicon nanowires contain multifunctional surface groups with different distributions, charges and/or surface properties. These types of wires tend to be more difficult to disperse in aqueous media even in the presence of one or more dispersants or surfactants as described previously. The oxidation of inorganic nanowires, for example, renders the surface of the nanowires more uniform, consequently allowing the wires to more easily be suspended in solution with less dispersant and without agglomeration.

The nanowires may be oxidized using a variety of processes including thermal oxidation or chemical oxidation (e.g., by chemically modifying the surfaces of nanowires in solution by, for example, using small molecules such as silanes with different end groups). In one embodiment, the nanowires are rapidly thermally oxidized by placing the nanowire bearing wafers into a rapid thermal oxidation (RTO) chamber which typically ramps the temperature of the chamber up to about 500° C. in a N2 atmosphere. In the RTO chamber, the temperature is then elevated rapidly, e.g., 100° C./sec, to the desired temperature, e.g., >850° C. (typically between 900 and 1100° C.) in oxygen, and allowed to sit in O2 saturated atmosphere for several minutes. The temperature is then brought back down to ambient temperatures in N2. Typically, at temperatures between 900 and 1100° C. for 1 to 10 minutes yields oxide layers of from about 50 to about 100 angstroms. Similar processes may be employed to provide a nitride or oxynitride shell on the core nanowire, using different reactive gases in addition to O2, including, e.g., NH3, N2O or NO. Alternatively, nitridation can be done over the oxide layer, e.g., by introducing such gases into the RTO chamber after oxidation. Likewise, RTO processes can be combined with alternating etch steps in a "grow-etch-grow" process, in order to provide a relatively defect free interface between the core nanowire and its surrounding oxide layer, by removing surface contamination and defects in the silicon nanowire (see, e.g., U.S. Pat. No. 6,380,103). While the etching step may be performed within the RTO chamber, it is generally less desirable as it may impact oxide formation steps. Typically, a vapor etch step is performed before oxide formation. Alternatively to using a RTO chamber, the nanowires may be oxidized in a conventional oxidation furnace using standard oxidation processes.

Applications of Nanowire Dispersion Compositions

The present invention also provides for electronic circuits comprising the nanowire dispersion compositions of the present invention. Suitably stable nanowire suspensions using the teachings of the present invention are useful building blocks for high performance electronics. A collection of nanowires orientated in substantially the same direction will have a high mobility value. Furthermore, nanowires can be flexibly processed in solution to allow for inexpensive manufacture. Collections of nanowires can be easily assembled onto any type of substrate from solution to achieve a thin film of nanowires. For example a thin film of nanowires used in a semiconductor device can be formed to include 2, 5, 10, 100, and any other number of nanowires between or greater than these amounts, for use in high performance electronics.

The nanowires of the present invention can also be used to make high performance composite materials when combined with polymers/materials such as organic semiconductor materials, which can be flexibly spin-cast on any type of substrate. Nanowire/polymer composites can provide properties superior to a pure polymer materials. Further detail on nanowire/polymer composites is provided below.

Collections or thin films of nanowires of the present invention can be aligned into being substantially parallel to each other, or can be left non-aligned or random. Non-aligned collections or thin films of nanowires provide electronic properties comparable or superior to polysilicon materials, which typically have mobility values in the range of 1-10 $cm^2/V \cdot s$.

Aligned thin films of nanowires of the present invention can be obtained in a variety of ways. For example, aligned thin films of nanowires can be produced by using the following techniques: (a) Langmuir-Blodgett film alignment; (b) fluidic flow approaches, such as described in U.S. Pat. No. 6,872,645, and incorporated herein by reference in its entirety; and (c) application of mechanical shear force. For example, mechanical shear force can be used by placing the nanowires between first and second surfaces, and then moving the first and second surfaces in opposite directions to align the nanowires. Aligned thin films of nanowires/polymer composites can be obtained using these techniques, followed by a spin-casting of the desired polymer onto the created thin film of nanowires. For example, nanowires can be deposited in a liquid polymer solution, alignment can then be performed according to one of these or other alignment processes, and the aligned nanowires can then be cured (e.g., UV cured, crosslinked, etc.). An aligned thin film of nanowires/polymer composite can also be obtained by mechanically stretching a randomly oriented thin film of nanowires/polymer composite.

P-doped nanowires and n-doped nanowires can be separately fabricated, and deposited in a homogeneous mixture onto a surface, such as a macroelectronic substrate. On a macroscopic level, the resulting material appears to contain a high concentration of both n- and p-dopants. By creating such a mixture of p- and n-doped nanowires, macroelectronic devices can be fabricated that respond as if they are both n- and p-doped. For example, a resulting thin film of nanowires that includes both n-doped and p-doped nanowires can exhibit characteristics of both n-doped and p-doped nanowires. For example, diode, transistor, and other known electrical devices can be fabricated to include a combination of p-doped nanowires and n-doped nanowires.

Nanowire dispersion compositions of the present invention can also be used to produce electrical devices such as p-n diodes, transistors, and other electrical device types, using nanowire heterostructures as described herein. Nanowire heterostructures include a plurality of p-n junctions along the length of the nanowire or in one or multiple core-shell structure(s) and can include alternating portions or segments along their lengths and/or coaxially that are differently doped.

Numerous electronic devices and systems can incorporate semiconductor or other type devices with thin films of nanowires produced by the processes of the present invention. Some example applications for the present invention are described below or elsewhere herein for illustrative purposes, and are not limiting. The applications described herein can include aligned or non-aligned thin films of nanowires, and can include composite or non-composite thin films of nanowires.

Semiconductor devices (or other type devices) can be coupled to signals of other electronic circuits, and/or can be integrated with other electronic circuits. Semiconductor devices can be formed on large flexible or rigid substrates, which can be subsequently separated or diced into smaller substrates. Furthermore, on large substrates (i.e., substrates substantially larger than conventional semiconductor wafers), semiconductor devices formed thereon can be interconnected.

The nanowire dispersion compositions of the present invention can also be incorporated in applications requiring a single semiconductor device, and to multiple semiconductor devices. For example, the nanowire dispersion compositions of the present invention are particularly applicable to large area, macro electronic substrates on which a plurality of semiconductor devices are formed. Such electronic devices can include display driving circuits for active matrix liquid crystal displays (LCDs), organic LED displays, field emission displays. Other active displays can be formed from a nanowire-polymer, quantum dots-polymer composite (the composite can function both as the emitter and active driving matrix). The nanowire dispersion compositions of the present invention are also applicable to smart libraries, credit cards, large area array sensors, and radio-frequency identification (RFID) tags, including smart cards, smart inventory tags, and the like.

The nanowire dispersion compositions of the present invention are also applicable to digital and analog circuit applications. In particular, the nanowire dispersion compositions of the present invention are useful in applications that require ultra large-scale integration on a large area substrate. For example, a thin film of nanowires produced by the processes of the present invention can be implemented in logic circuits, memory circuits, processors, amplifiers, and other digital and analog circuits.

The nanowire dispersion compositions of the present invention can be applied to photovoltaic applications. In such applications, a clear conducting substrate is used to enhance the photovoltaic properties of the particular photovoltaic device. For example, such a clear conducting substrate can be used as a flexible, large-area replacement for indium tin oxide (ITO) or the like. A substrate can be coated with a thin film of nanowires that is formed to have a large bandgap, i.e., greater than visible light so that it would be non-absorbing, but would be formed to have either the HOMO or LUMO bands aligned with the active material of a photovoltaic device that would be formed on top of it. Clear conductors can be located on two sides of the absorbing photovoltaic material to carry away current from the photovoltaic device. Two different nanowire materials can be chosen, one having the HOMO aligned with that of the photovoltaic material HOMO band, and the other having the LUMO aligned with the LUMO band of the photovoltaic material. The bandgaps of the two nanowires materials can be chosen to be much larger than that of the photovoltaic material. The nanowires, according to this embodiment, can be lightly doped to decrease the resistance of the thin films of nanowires, while permitting the substrate to remain mostly non-absorbing.

Hence, a wide range of military and consumer goods can incorporate the nanowires dispersion compositions of the present invention. For example, such goods can include personal computers, workstations, servers, networking devices, handheld electronic devices such as PDAs and palm pilots, telephones (e.g., cellular and standard), radios, televisions, electronic games and game systems, displays (e.g., active matrix displays), home security systems, automobiles, aircraft, boats, medical devices, other household and commercial appliances, and the like.

For the myriad electronics applications described above, the surfactants, binders, stabilizers and/or other chemicals in the nanowire dispersion composition that have been added to a suspension of nanowires to improve coating properties may have a negative impact on the electrical properties of the thin film formed by the nanowires. In these cases, it may be desirable to remove these chemicals without disturbing the nanowires, e.g., to provide adequate electrical connectivity between the nanowire surface and the device contacts following deposition of the nanowires on the substrate surface. Some methods, such as washing the residual chemicals away, tend to remove the nanowires as well. In addition to chemical methods of cleaning, physical methods such as plasma cleaning using, e.g., an oxygen, radio frequency plasma to remove surface contaminants can be employed. Other physical methods which can be used to clean the substrate surfaces include laser cleaning, other low damage, gas phase cleaning methods, and perhaps molecular cleaning (e.g., the removal of all contamination on a molecular scale).

EXAMPLES

The following non-limiting examples illustrate nanowire dispersion compositions according to the teachings of the present invention.

Materials: The following raw materials were used to prepare the nanowire dispersion compositions in the Examples which follow:

The nonionic surfactants used in the Examples are Surfynol 420, Surfynol 440, Surfynol 211, and Surfynol 221 obtained from Air products, PA; the block copolymer of Pluronic-17R, Pluronic L-31, Pluronic L-61, Pluronic L-62, Pluronic L-64, Pluronic L-81, Pluronic L-92, Pluronic L-101, Pluronic F-77, and Pluronic F-88 were obtained from BASF; SilwetL-77, SilwetL-7608, SilwetL-7087, SilwetL-7280, and SilwetL-8620 were obtained from GE Silicones.

The ammonium polyacrylate was commercially obtained as ACRYSOL G-111 from Rhom & Hass. Polyurethane latex designated as SANCORE 2725 was obtained from Noveon, Inc. Cleveland, Ohio. Polyvinyl alcohol (PVA), polyvinyl pyrrolidone (PVP), Triton X-100, Triton X-405, Tween 40, and Span 20 were obtained from Aldrich.

Table 1 provided below shows the various anionic, cationic, nonionic and polymeric surfactants which were used in the supporting Examples below.

TABLE 1

| ID | MW | HLB | Dispersants Inf. | Venders |
|---|---|---|---|---|
| Surfynol 440 | NA | 8 | Nonionic surfactant | Air Products and Chemicals, inc. |
| Surfynol 420 | NA | 4 | Nonionic surfactant | Air Products and Chemicals, inc. |
| Surfynol 211 | NA | 8-11 | Nonionic surfactant | Air Products and Chemicals, inc. |
| Surfynol 221 | NA | 11-15 | Nonionic surfactant | Air Products and Chemicals, inc. |
| Pluronic L-17R4 | 2650 | 12 | Block copolymer | BASF Corporation |
| Pluronic L-64 | 2900 | 15 | Block copolymer | BASF Corporation |
| Pluronic L-62 | 2500 | 7 | Block copolymer | BASF Corporation |
| Pluronic L-81 | 2750 | 2 | Block copolymer | BASF Corporation |
| Pluronic F-77 | 6600 | 25 | Block copolymer | BASF Corporation |
| Pluronic F-88 | 11400 | 28 | Block copolymer | BASF Corporation |
| Pluronic L-101 | 3800 | 1 | Block copolymer | BASF Corporation |
| Pluronic L-61 | 2900 | 15 | Block copolymer | BASF Corporation |
| Pluronic L-31 | 1100 | 5 | Block copolymer | BASF Corporation |
| Pluronic L-92 | 3650 | 6 | Block copolymer | BASF Corporation |
| SilWet L-77 | 600 | 5-8 | Trisiloxane, all EO | Crompton Corp. |
| SilWet L-7280 | 600 | 5-8 | Trisiloxane, EO/PO (60/40) | Crompton Corp. |
| SilWet L-7087 | 20000 | 9-12 | Pendant siloxane, EO/PO (40/60) | Crompton Corp. |
| SilWet L-7608 | 600 | 5-8 | Trisiloxane, all EO | Crompton Corp. |
| SilWet L-7650 | 3000 | 5-8 | Pendant siloxane, all EO | Crompton Corp. |
| SilWet L-8620 | 2000 | 5-8 | Linear siloxane, all EO | Crompton Corp. |
| Triton-X100 | ~660 | 13.5 | Polyoxyethylene(10) isooctylcyclohexyl ether | Aldrich |
| Triton-X405 | ~2000 | 17.9 | Polyoxyethylene(40) isooctyclphenyl ether | Aldrich |
| Span 20 | 346 | 8.6 | Nonionic surfactant | Aldrich |
| Tween 40 | 1248 | 15.6 | Nonionic surfactant | Aldrich |
| SANCORE 2725 | NA | | Polyurethane latex | Noveon, Inc |
| Acrysol G-111 | NA | | Ammonium Polyacrylate | ROHM&HAAS |
| PVA | ~40,000 | | Polyvinyl alcohol | Aldrich |
| PVP | 55,000 | | Polyvinyl pyrrolindone | Aldrich |

Nanowire synthesis: Crystalline Si nanowires were grown using the VLS method described above. Wires were grown at atmospheric pressure on four-inch wafers using $SiH_4$ as the gas precursor. The nanowire growth occurred at 490° C. for 90 minutes. Au nanoparticles of 60 nm in diameter were randomly placed on the wafers and used as catalyst for the VLS reaction. All wafers were processed in the same way.

Sonication: Every four nanowire growth wafers were separately immersed in a 1000 ml beaker with 150 ml de-ionized (DI) water/ethanol (4/1) solution. The beaker was sonicated in a water bath to transfer nanowires into the solution by using power level 5 for 2 min. The nanowire solution was concentrated by stirred cell membrane filtration.

Stirred cell membrane filtration: The nanowire solution was concentrated by using a 43 mm diameter stirred cell. A polycarbonate membrane with an 8 um pore size was used to filter out the water as well as some small wire junks (<10 um) and keep the concentrated nanowires at the top of the membrane.

Control 1

The 0.01 weight per cent nanowire in DI water solution was coated on a VITEX film by using a #8 Meyer rod. The coating was dried in an 80° C. oven for 5 min. Then, a dark field optical microscope was used to record the images of the nanowire coated film. The wire dispersability was visually inspected based on the level of the wire aggregates on the picture. It was found that there were many large wire aggregates in this sample and the wire dispersion was very poor.

Example 1-1

A dispersion mixture was made by adding 0.04 g of Surfynol 440 to 2 g of nanowire solution (in Control 1) and mixing. The mixture was coated on a VITEX film surface by using a #8 Meyer rod. The coating was dried in an 80° C. oven for 5 min. Then, an optical microscope was used to record the wire dispersion on the coating. The wire dispersability was visually inspected based on the level of the wire aggregates. It was found that compared to the Control 1 (without surfactant), much better wire dispersion of the coating was noticed in Example 1-1.

Example 1-2

Example 1-2 was prepared according to the procedure for Example 1-1 except that instead of Surfynol 440, 0.01 g of polyvinyl alcohol was added to 2 g nanowire solution (0.01 weight per cent nanowire) and mixed therewith. It was found that compared to the Control 1 (without surfactant), better wire dispersion of the coating was noticed in Example 1-2.

Example 1-3

Example 1-3 was prepared according to the procedure for Example 1-1 except that in addition 0.01 g of polyvinyl alcohol was added to the mixture of Example 1-1. It was found that compared to Control 1 and Example 1-2, wire dispersion in Example 1-3 was further improved by mixing together both short chain surfactant (Surfynol 440) and long chain water soluble polymer (PVA).

Example 1-4

Example 1-4 was prepared according to the procedure for Example 1-3 except that instead of polyvinyl alcohol, 0.03 g of polyvinyl pyrrolidone (PVP) was added to the mixture of Example 1-3. It was found that compared to Control 1 and Examples 1-2, the addition of both short chain surfactant (Surfynol 440) and long chain water soluble polymer (PVP) provided further improvement in wire dispersion.

Example 1-5

Example 1-5 was prepared according to the procedure for Example 1-1 except that instead of Surfynol 440, 0.03 g of Surfynol 211 was added to 2 g nanowire solution (0.01 weight per cent nanowire) and mixed therewith. It was found that compared to the Control 1 (without surfactant), better wire dispersion of the coating was noticed in Example 1-5, although the coating uniformity was not as good as in the previous Examples 1-1 through 1-4.

Example 1-6

Example 1-6 was prepared according to the procedure for Example 1-1 except that instead of Surfynol 440, 0.03 g of Surfynol 221 was added to 2 g nanowire solution (0.01 weight per cent nanowire) and mixed therewith. It was found that compared to the Control 1 (without surfactant), better wire dispersion of the coating was noticed in Example 1-6.

Example 1-7

Example 1-7 was prepared according to the procedure for Example 1-1 except that instead of Surfynol 440, 0.03 g of Triton X-100 was added to 2 g nanowire solution (0.01 weight per cent nanowire) and mixed therewith. It was found that compared to the Control 1 (without surfactant), better wire dispersion of the coating was noticed in Example 1-7.

Example 1-8

Example 1-8 was prepared according to the procedure for Example 1-1 except that instead of Surfynol 440, 0.03 g of Triton X-405 was added to 2 g nanowire solution (0.01 weight per cent nanowire) and mixed therewith. It was found that compared to the Control 1 (without surfactant), better wire dispersion of the coating was noticed in Example 1-8.

Example 1-9

Example 1-9 was prepared according to the procedure for Example 1-1 except that instead of Surfynol 440, 0.03 g of Span 20 was added to 2 g nanowire solution (0.01 weight per cent nanowire) and mixed therewith. It was found that compared to the Control 1 (without surfactant), better wire dispersion of the coating was noticed in Example 1-9.

Example 1-10

Example 1-10 was prepared according to the procedure for Example 1-1 except that instead of Surfynol 440, 0.03 g of Tween 40 was added to 2 g nanowire solution (0.01 weight per cent nanowire) and mixed therewith. It was found that compared to the Control 1 (without surfactant), better wire dispersion of the coating was noticed in Example 1-10.

The results of the first set of Examples are summarized in Table 2 below. As shown, the surfactants having lower molecular weights and lower HLB values (e.g., less than about 10, e.g., less than about 8) such as Surfynol 420 and 440 surfactants, provided the most improved nanowire dispersability compared to the Control. The proper combination of one or more water soluble polymers such as PVP or PVA to the dispersion composition with surfactant can further improve the dispersability of the nanowires and the coating surface properties.

TABLE 2

| Samples | Nanowire solution (g) | Dispersants | Wt % (based on total Wt of Nanowires solution) | Nanowire dispersability on coated VITEX film versus Control 1 |
|---|---|---|---|---|
| Example 1-1 | 2 | Surfynol 440 | 2 | Improved |
| Example 1-2 | 2 | PVA | 1 | Improved |
| Example 1-3 | 2 | Surfynol 440/PVA | 2/0.5 | Much Improved |
| Example 1-4 | 2 | Surfynol 440/PVP | 2/1.5 | Much Improved |
| Example 1-5 | 2 | Surfynol 211 | 1.5 | Improved |
| Example 1-6 | 2 | Surfynol 221 | 1.5 | Improved |
| Example 1-7 | 2 | Triton X-100 | 1.5 | Improved |
| Example 1-8 | 2 | Triton X-405 | 1.5 | Improved |
| Example 1-9 | 2 | Span 20 | 1.5 | Improved |
| Example 1-10 | 2 | Tween 40 | 1.5 | Improved |

Control 2

Control 2 was prepared according to the procedure for Control 1 except that 0.05 weight per cent nanowire in DI water/ethanol (3/7) solution was coated on a VITEX film by using a #8 Meyer rod. The coating was dried in an 80° C. oven for 5 min. Then, a dark field optical microscope was used to record the images of the nanowire coated film. The wire dispersability was visually inspected based on the level of the wire aggregates on the picture. It was found that there were many large wire aggregates in this sample and the wire dispersion was very poor.

Example 2-1

Example 2-1 was prepared according to the procedure for Control 2 except that 0.05 g of Pluronic-17R4 was added to 1 g nanowire solution (Control 2 nanowire solution) and mixed therewith. The optical microscope picture result shows that compared to the Control 2 (without surfactant), better wire dispersion of the coating was noticed in Example 2-1.

Example 2-2

Example 2-2 was prepared according to the procedure for Example 2-1 except that instead of Pluronic-17R4, 0.05 g of Pluronic L-64 was added to 1 g nanowire solution (Control 2 nanowire solution) and mixed therewith. The optical microscope picture result shows that compared to Control 2 (without surfactant) and Example 2-1, better wire dispersion of the coating was noticed in Example 2-2.

Example 2-3

Example 2-3 was prepared according to the procedure for Example 2-1 except that instead of Pluronic-17R4, 0.05 g of Pluronic L-62 was added to 1 g nanowire solution (Control 2 nanowire solution) and mixed therewith. The optical microscope picture result shows that compared to Control 2 (without surfactant) and Examples 2-1 and 2-2, better wire dispersion of the coating was noticed in Example 2-3.

Example 2-4

Example 2-4 was prepared according to the procedure for Example 2-1 except that instead of Pluronic-17R4, 0.05 g of Pluronic L-81 was added to 1 g nanowire solution (Control 2 nanowire solution) and mixed therewith. The optical microscope picture result shows that compared to the Control and Examples 2-1 through 2-3, the best wire dispersion of the coating was noticed in Example 2-4.

Example 2-5

Example 2-5 was prepared according to the procedure for Example 2-4 except that instead of Pluronic L-81, 0.05 g of Pluronic L-101 was added to 1 g nanowire solution (Control 2 nanowire solution) and mixed therewith. The optical microscope picture result shows that the wire dispersion was improved over the Control 2, but was not as good as compared to Example 2-4.

Example 2-6

Example 2-6 was prepared according to the procedure for Example 2-5 except that instead of Pluronic L-101, 0.05 g of Pluronic F-88 was added to 1 g nanowire solution (Control 2 nanowire solution) and mixed therewith. The optical microscope picture result shows that the wire dispersion was similar to the Control 2.

Example 2-7

Example 2-7 was prepared according to the procedure for Example 2-6 except that instead of Pluronic F-88, 0.05 g of Pluronic F-77 was added to 1 g nanowire solution (Control 2 nanowire solution) and mixed therewith. The optical microscope picture result shows that the wire dispersion was similar to the Control 2.

Example 2-8

Example 2-8 was prepared according to the procedure for Example 2-7 except that instead of Pluronic F-77, 0.05 g of Pluronic L-31 was added to 1 g nanowire solution (Control 2 nanowire solution) and mixed therewith. Although the wire dispersion was improved over Control 2, the wire dispersion was not as good as compared to Example 2-4.

Example 2-9

Example 2-9 was prepared according to the procedure for Example 2-8 except that instead of Pluronic L-31, 0.05 g of Pluronic L-92 was added to 1 g nanowire solution (Control 2 nanowire solution) and mixed therewith. Although the wire dispersion was improved over Control 2, the wire dispersion was not as good as compared to Examples 2-4 and 2-8.

Example 2-10

Example 2-11 was prepared according to the procedure for Example 2-2 except that in addition 2% (based on total weight of nanowire solution) of SANCORE 2725 (polyurethane latex dispersion) was added to 1 g of nanowire solution (Control 2 nanowire solution). The optical microscope picture result shows that the wire dispersion was improved as compared to the Control 2 (and Example 2-2). In addition, coating surface tackiness was improved by adding PU latex.

The results of the second set of Examples are summarized in Table 3 below. As shown, the Pluronic polymer surfactants having lower molecular weights and lower HLB values (e.g., less than about 10, e.g., less than about 8) such as Pluronic L-31, L-62, and L-81, provided the most improved nanowire dispersability compared to the Control. The addition of PU latex to the nanowire dispersion can help protect the nanowire dispersion coating surface without sacrificing the dispersability of the nanowires.

TABLE 3

| Samples | Nanowire solution (g) | Dispersants | Wt % (based on total Wt of nanowire solution) | Nanowire dispersability on coated VITEX film compared to Control 2 |
|---|---|---|---|---|
| Example 2-1 | 1 | Pluronic L-17R4 | 2.5 | Improved |
| Example 2-2 | 1 | Pluronic L-64 | 2.5 | Improved |
| Example 2-3 | 1 | Pluronic L-62 | 2.5 | Much Improved |
| Example 2-4 | 1 | Pluronic L-81 | 2.5 | Most Improved |
| Example 2-5 | 1 | Pluronic L-101 | 2.5 | Improved |
| Example 2-6 | 1 | Pluronic F-88 | 2.5 | Same |
| Example 2-7 | 1 | Pluronic F-77 | 2.5 | Same |
| Example 2-8 | 1 | Pluronic L-31 | 2.5 | Much Improved |
| Example 2-9 | 1 | Pluronic L-92 | 2.5 | Improved |
| Example 2-10 | 1 | Pluronic L-64/ Sancure 2725 | 2.5/2 | Improved |

Control 3

Control 3 was prepared according to the procedure for Control 1 except that 0.05 weight per cent nanowire in DI water/ethanol (8/2) solution was coated on a VITEX film by using a #8 Meyer rod. The coating was dried in an 80° C. oven for 5 min. Then, a dark field optical microscope was used to record the images of the nanowire coated film. The wire dispersability was visually inspected based on the level of the wire aggregates on the picture. It was found that there were many large wire aggregates in this sample and the wire dispersion was very poor.

Example 3-1

Example 3-1 was prepared according to the procedure for Control 3 except that 0.01 g of Silwet L-77 was added to 1 g nanowire solution (Control 3 nanowire solution) and mixed therewith. The optical microscope picture result shows that compared to the Control 3, slightly better wire dispersion of the coating was noticed in Example 3-1.

Example 3-2

Example 3-2 was prepared according to the procedure for Example 3-1 except that in addition 0.01 g of AG-111 was added to the mixture of Example 3-1 nanowire solution and mixed again. After coating, the optical microscope picture result shows that compared to the Example 3-1, much better wire dispersion of the coating was noticed in Example 3-2.

Example 3-3

Example 3-3 was prepared according to the procedure for Control 3 except that 0.01 g of Silwet L-7608 was added to 1 g nanowire solution (Control 3 nanowire solution) and mixed therewith. The optical microscope picture result shows that compared to the Control 3, slightly better wire dispersion of the coating was noticed in Example 3-3.

Example 3-4

Example 3-4 was prepared according to the procedure for Example 3-3 except that in addition 0.01 g of AG-111 was added to the mixture of Example 3-3 nanowire solution and mixed again. After coating, the optical microscope picture result shows that compare to Example 3-3, much better wire dispersion of the coating was noticed in Example 3-4.

Example 3-5

Example 3-5 was prepared according to the procedure for Control 3 except that 0.01 g of Silwet L-7280 was added to 1 g nanowire solution (Control 3 nanowire solution) and mixed therewith. The optical microscope picture result shows that the wire dispersion of the coating was improved over the Control 3.

Example 3-6

Example 3-6 was prepared according to the procedure for Example 3-5 except that in addition 0.01 g of AG-111 was added to the mixture of Example 3-5 nanowire solution and mixed again. After coating, the optical microscope picture result shows that compared to the Example 3-5, much better wire dispersion of the coating was noticed in Example 3-6.

Example 3-7

Example 3-7 was prepared according to the procedure for Control 3 except that 0.01 g of Silwet L-7087 was added to 1 g nanowire solution (Control 3 nanowire solution) and mixed therewith. The optical microscope picture result shows that the nanowire dispersion was not as good as Control 3.

Example 3-8

Example 3-8 was prepared according to the procedure for Example 3-7 except that in addition 0.01 g of AG-111 was added to the mixture of Example 3-7 nanowire solution and mixed again. After coating, the optical microscope picture result shows that compared to the Example 3-7, much better wire dispersion of the coating was noticed in Example 3-8.

Example 3-9

Example 3-9 was prepared according to the procedure for Control 3 except that 0.01 g of Silwet L-7650 was added to 1 g nanowire solution (Control 3 nanowire solution) and mixed therewith. The optical microscope picture result shows the nanowire dispersion was not as good as Control 3.

Example 3-10

Example 3-10 was prepared according to the procedure for Example 3-9 except that in addition 0.01 g of AG-111 was added to the mixture of Example 3-9 nanowire solution and mixed again. After coating, the optical microscope picture result show that compared to the Example 3-9, much better wire dispersion of the coating was noticed in Example 3-10.

Example 3-11

Example 3-11 was prepared according to the procedure for Control 3 except that 0.01 g of Silwet L-8620 was added to 1 g nanowire solution (Control 3 nanowire solution) and mixed therewith. The optical microscope picture result shows that the nanowire dispersion was not as good as compared to Control 3.

Example 3-12

Example 3-12 was prepared according to the procedure for Example 3-11 except that in addition 0.01 g of AG-111 was added to the mixture of Example 3-11 nanowire solution and mixed again. After coating, the optical microscope picture result shows that compared to the Example 3-11, much better wire dispersion of the coating was noticed in Example 3-12.

The results of the third set of Examples are summarized in Table 4 below. As shown, the SilWet surfactants having lower molecular weights and lower HLB values such as SilWet L-77, L-7608, L-7087 and L-7280 provided the most improved nanowire dispersability compared to the Control. The addition of water soluble polymers such as AG-111 to the nanowire dispersion composition further enhanced the dispersion of the nanowires in the liquid composition.

TABLE 4

| Samples | Nanowire solution (g) | Dispersants | Wt % (based on total Wt of nanowire solution) | Nanowire dispersability on coated film versus Control 3 |
|---|---|---|---|---|
| Example 3-1 | 1 | SilWet L-77 | 1 | Improved |
| Example 3-2 | 1 | SilWet L-77/ AG-111 | 1/1 | Much Improved |
| Example 3-3 | 1 | SilWet L-7608 | 1 | Improved |
| Example 3-4 | 1 | SilWet L-7608/ AG-111 | 1/1 | Much Improved |
| Example 3-5 | 1 | SilWet L-7280 | 1 | Improved |
| Example 3-6 | 1 | SilWet L-7280/ AG-111 | 1/1 | Much Improved |
| Example 3-7 | 1 | SilWet L-7087 | 1 | Improved |
| Example 3-8 | 1 | SilWet L-7087/ AG-111 | 1/1 | Much Improved |
| Example 3-9 | 1 | SilWet L-7650 | 1 | Same |
| Example 3-10 | 1 | SilWet L-7650/ AG-111 | 1/1 | Improved |
| Example 3-11 | 1 | SilWet L-8620 | 1 | Same |
| Example 3-12 | 1 | SilWet L-8620/ AG-111 | 1/1 | Improved |

Example 4

The following non-limiting example illustrates improved nanowire dispersion by forming an oxide layer on the nanowires prior to dispersing the wires in solution, according to the teachings of the present invention Nanowire synthesis: Crystalline Si nanowires were grown using the VLS method described above. Wires were grown at atmospheric pressure on four-inch wafers using SiH4 as the gas precursor. The nanowire growth occurred at 490° C. for 90 minutes. Au nanoparticles of 60 nm in diameter were randomly placed on the wafers and used as catalyst for the VLS reaction. All wafers were processed in the same way.

Nanowire oxidation: Wafers with nanowires were subject to dry thermal oxidation at 900° C. in $O_2$ ambient at atmospheric pressure in a Rapid Thermal Oxidation (RTO) system. The oxidation phase was 8 minutes long, while a one minute chamber conditioning at 500° C. was run immediately prior to that. This process typically grows 10-12 nm of SiO2 in the RTO system. A similar process can be performed using standard furnace oxidation systems, adjusting the duration accordingly. Oxidation also can be run using higher temperatures, typically up to about 1000° C. The oxidation time needs to be shortened accordingly in that case. The quality of the oxide is typically not very different within this interval.

Sonication: Every four nanowire growth wafers were separately immerged in to a 1000 ml beaker with 150 ml DI water/ethanol (2/1) solution. The beaker was sonicated in a water bath to transfer nanowires into the solution by using power level 5 for 2 min. The nanowire solutions were concentrated by stirred cell membrane filtration.

Stirred cell filtration: Nanowire solution was concentrated by using a 43 mm in diameter stirred cell. A polycarbonate membrane with a 12 um pore size was used to filter out the water and keep the concentrated nanowires at the top of the membrane.

Control 4

Nanowires without further surface oxidation were sonicated off and concentrated to 0.03 wt % in a DI water/ethanol (80/20) solution by membrane filtration. A dispersion mixture was made by first adding 0.03 g of Surfynol 440 and 0.015 g of Pluronic-L64 to 1 g of nanowire solution (0.03 wt %) and mixing. Then, 0.015 g of Acrysol G-111 was introduced in solids to the mixture and mixed again. The final mixture was coated on a VITEX film surface by using a 7 mm doctor blade hand drawdown. The coating was dried in an 80° C. oven for 5 min. Then, a dark field optical microscope was used to image the wire dispersion of the coating. The wire dispersability was visually inspected based on the level of the wire aggregates. It was found that there were many large aggregates in this coating.

Example 4-1

Example 4-1 was prepared according to the same procedure for the Control 4 except that the surface oxidized nanowires were used to replace the nanowires used in the Control 4. After coating, the optical microscope pictures shows that compared to the Control 4, the aggregates in the coating have been significantly reduced due to the surface oxidation treatment.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

All publications, patents and patent applications mentioned in this specification are indicative of the level of skill of those skilled in the art to which this invention pertains, and are herein incorporated by reference to the same extent as if each individual publication, patent or patent application was specifically and individually indicated to be incorporated by reference.

What is claimed:

1. A nanowire dispersion composition comprising a plurality of nanowires comprising silicon suspended in an aqueous or non-aqueous solution comprising at least one low molecular weight dispersant, wherein the nanowires include a thermally grown oxide layer on an outermost surface of the nanowires, wherein the thermally grown oxide layer is formed in addition to any oxide layer resulting from synthesis of the nanowires.

2. The nanowire dispersion composition of claim 1, wherein the dispersant is selected from a nonionic or polymeric surfactant.

3. The nanowire dispersion composition of claim 2, wherein the dispersant comprises a block copolymer, a trisiloxane, a pendant siloxane or a linear siloxane.

4. The nanowire dispersion composition of claim 1, wherein the dispersant has an HLB value less than about 20.

5. The nanowire dispersion composition of claim 4, wherein the dispersant has an HLB value less than about 10.

6. The nanowire dispersion composition of claim 1, wherein the dispersant has a molecular weight less than about 5,000.

7. The nanowire dispersion composition of claim 1, wherein the dispersant has a molecular weight less than about 3,000.

8. The nanowire dispersion composition of claim 1, wherein the dispersant has a molecular weight less than about 1,000.

9. The nanowire dispersion composition of claim 1, wherein the at least one dispersant comprises a block copolymer.

10. The nanowire dispersion composition of claim 9, wherein the block copolymer comprises a diblock copolymer.

11. The nanowire dispersion composition of claim 1, wherein the nanowire dispersion composition comprises from 0.01 to 20 wt % dispersant.

12. The nanowire dispersion composition of claim 1, wherein the nanowire dispersion composition comprises between about 1.0 to 15 wt % dispersant.

13. The nanowire dispersion composition of claim 1, wherein the nanowire dispersion composition comprises from about 1 to 8 wt % dispersant.

14. The nanowire dispersion composition of claim 1, wherein the aqueous or non-aqueous solution comprises distilled water, ethanol, methanol or mixtures thereof.

15. The nanowire dispersion composition of claim 1, further comprising one or more binders.

16. The nanowire dispersion composition of claim 15, wherein the one or more binders comprise one or more water soluble polymers selected from the group comprising polyvinyl alcohol, polyvinyl pyrrolidone, methyl cellulose, and hydroxyl ethyl cellulose.

17. The nanowire dispersion composition of claim 2, further comprising a long chain polymeric dispersant selected from the group comprising ammonium polyacrylate acrysol, PVA, and PVP.

18. A flexible substrate comprising the nanowire dispersion composition of claim 1 deposited as a thin film thereon.

19. A rigid substrate comprising the nanowire dispersion composition of claim 1 deposited as a thin film thereon.

20. An active matrix display backplane comprising the nanowire dispersion composition of claim 1 deposited as a thin film thereon.

21. A plastic substrate having the nanowire dispersion composition of claim 1 coated as a thin film thereon.

22. The nanowire dispersion composition of claim 1, wherein the plurality of nanowires have an aspect ratio greater than about 10.

23. The nanowire dispersion composition of claim 22, wherein the plurality of nanowires have an aspect ratio greater than about 100.

24. The nanowire dispersion composition of claim 22, wherein the plurality of nanowires have an aspect ratio greater than about 1000.

25. A nanowire dispersion composition comprising a plurality of nanowires comprising silicon suspended in aqueous or non-aqueous solution comprising at least one low molecular weight block copolymer dispersant, wherein the nanowires include a thermally grown oxide layer on an outermost surface of the nanowires, wherein the thermally grown oxide layer is formed in addition to any oxide layer resulting from synthesis of the nanowires.

26. The nanowire dispersion composition of claim 25, wherein the dispersant comprises one or more block polymers having a molecular weight less than about 5,000.

27. The nanowire dispersion composition of claim 1, wherein the nanowire dispersion composition comprises from greater than 10 to 20 wt % dispersant.

28. The nanowire dispersion composition of claim 25, wherein the nanowire dispersion composition comprises from greater than 10 to 20 wt % dispersant.

29. A nanowire dispersion composition comprising a plurality of nanowires suspended in aqueous or non-aqueous solution, wherein the solution comprises at least one dispersant having a low molecular weight and a low HLB value.

30. The nanowire dispersion composition of claim 29, further comprising at least one binder.

31. The nanowire dispersion composition of claim 30, wherein the at least one polymeric or polymerisable binder comprises a long chain polymeric dispersant.

32. The nanowire dispersion composition of claim 29, wherein the solution is an aqueous solution, and wherein the nanowire dispersion composition further comprises one or more water-soluble or water-dissipatable polymeric or polymerisable binders.

33. The nanowire dispersion composition of claim 29, further comprising one or more organic solvents.

34. The nanowire dispersion composition of claim 29, wherein the solution comprises at least 20 wt % water.

35. The nanowire dispersion composition of claim 29, wherein the solution comprises at least 50 wt % water.

36. The nanowire dispersion composition of claim 29, wherein the nanowires include a chemically or thermally grown oxide layer on an outermost surface of the nanowires, and wherein the oxide layer is formed in addition to any oxide layer resulting from synthesis of the nanowires.

37. The nanowire dispersion composition of claim 29, wherein the nanowire dispersion composition comprises from greater than 10 to 20 wt % dispersant.

* * * * *